United States Patent
Lupo et al.

(10) Patent No.: US 9,927,492 B2
(45) Date of Patent: Mar. 27, 2018

(54) CELL MONITORING APPARATUS, BATTERY MONITORING APPARATUS, INTEGRATED CIRCUIT AND METHOD OF MONITORING A RECHARGEABLE CELL

(71) Applicants: Savino Luigi Lupo, Munich (DE); Michael Hutterer, Dachau (DE); Antonino Leone, Neufahrn (DE)

(72) Inventors: Savino Luigi Lupo, Munich (DE); Michael Hutterer, Dachau (DE); Antonino Leone, Neufahrn (DE)

(73) Assignee: NXP USA, Inc., Austin, TX (US)

( * ) Notice: Subject to any disclaimer, the term of this patent is extended or adjusted under 35 U.S.C. 154(b) by 235 days.

(21) Appl. No.: 14/890,941

(22) PCT Filed: May 29, 2013

(86) PCT No.: PCT/IB2013/054437
§ 371 (c)(1),
(2) Date: Nov. 13, 2015

(87) PCT Pub. No.: WO2014/191794
PCT Pub. Date: Dec. 4, 2014

(65) Prior Publication Data
US 2016/0084913 A1    Mar. 24, 2016

(51) Int. Cl.
*G01R 31/36* (2006.01)
*H01M 10/42* (2006.01)

(52) U.S. Cl.
CPC ..... *G01R 31/3651* (2013.01); *G01R 31/3624* (2013.01); *G01R 31/3658* (2013.01);
(Continued)

(58) Field of Classification Search
CPC .............. G01R 31/3651; G01R 3/3624; G01R 31/3658; G01R 31/3679
See application file for complete search history.

(56) References Cited

U.S. PATENT DOCUMENTS 8,008,891 B2    8/2011  Yun et al.
8,072,185 B2 *  12/2011  Nam ................... H01M 10/441
                                            320/116
(Continued)

FOREIGN PATENT DOCUMENTS

| KR | 1020080012079 | 2/2008 |
| KR | 1020120076744 | 7/2012 |
| KR | 1020130049920 | 5/2013 |

OTHER PUBLICATIONS

International Search Report and Written Opinion correlating to PCT/IB2013/054437 dated Feb. 27, 2014.
(Continued)

*Primary Examiner* — Pho M Luu

(57) ABSTRACT

A cell monitoring apparatus includes a processor and memory arranged to execute code representing a linear time-invariant state transition model and a non-linear observation model are provided to model a rechargeable cell using at least a non-linear open circuit voltage, an internal resistance, a time-invariant distortion voltage across a reactive component block, and a distortion current component constituting an error of measurement of current flowing through the reactive component block. An estimator unit performs extended Kalman filtering in respect of the state transition model and the observation model using the input state data in order to generate output state data. The processor is arranged to evaluate a criterion associated with at least part of the output state data and to generate a control signal in response to evaluation of the criterion.

19 Claims, 4 Drawing Sheets

(52) U.S. Cl.
CPC ..... *G01R 31/3662* (2013.01); *G01R 31/3679* (2013.01); *H01M 2010/4278* (2013.01); *H01M 2220/20* (2013.01)

(56) References Cited

U.S. PATENT DOCUMENTS

| | | |
|---|---|---|
| 8,099,180 B2 | 1/2012 | Schoch |
| 8,598,845 B2 * | 12/2013 | Lim ................ H02J 7/0016 320/119 |
| 2013/0116954 A1 | 5/2013 | Tazoe et al. |
| 2017/0133867 A1 * | 5/2017 | Banos ............... H02J 7/0026 |

OTHER PUBLICATIONS

Jingyu Yan, Guoqing Xu, Huihuan Qian, Yangsheng Xu, Robust State of Charge Estimation for Hybrid Electric Vehicles: Framework and Algorithms. Published www.mdpi.com/journal/energies on Sep. 30, 2012 on Energies ISSN 1996-1073.

Do, Dinh Vinh, Impedance Observer for a Li-Ion Battery Using Kalman Filter, IEEE Transactions on Vehicular Technology, vol. 58, No. 8, Oct. 2009, pp. 3930-3937.

* cited by examiner

CELL MONITORING APPARATUS, BATTERY MONITORING APPARATUS, INTEGRATED CIRCUIT AND METHOD OF MONITORING A RECHARGEABLE CELL

FIELD OF THE INVENTION

This invention relates to a cell monitoring apparatus, a battery monitoring apparatus, an integrated circuit and a method of monitoring a rechargeable cell.

BACKGROUND OF THE INVENTION

In the field of vehicles driven at least in part by a battery powering an electric motor, it is known to monitor certain parameters of the battery to ensure efficient operation of the battery and maintain the "health" of the battery. The State of Health of the battery is a "measure" that reflects the general condition of a battery and its ability to deliver a specified performance compared with a fresh battery. During the lifetime of a battery, the battery performance or "health" tends to deteriorate gradually due to irreversible physical and chemical changes that take place with usage and with age until eventually the battery is no longer usable or "dead".

As State of Health does not correspond to a particular physical quality, there is currently no consensus on how the State of Health should be determined. The designer of a battery management system may use any of the following parameters (singly or in combination) to define the State of Health of the battery: internal resistance/impedance; capacity; open-circuit voltage; self-discharge; ability to accept a charge; and/or number of charge-discharge cycles.

In order to monitor some parameters of the battery, a current drawn by the battery may be measured and such measurement of the current drawn can be affected by a so-called offset current. The offset current, if not taken into account, can render subsequent estimates of the State of Charge (SoC) of the battery inaccurate. Known SoC estimation techniques that are sensitive to the offset current include simple Coulomb counting techniques and more sophisticated techniques that compare an actual output of the battery to an estimated output ("State Observer" techniques).

A number of offset compensation techniques exist to improve the accuracy of the estimation of the SoC of the battery. However, when the measurement of the current being drawn has a particularly large error, for example due to a faulty current sensor, the most accurate SoC estimation techniques fail to be sufficiently accurate. Such sophisticated techniques also require knowledge of certain physical parameters used to estimate the SoC of the battery, resulting in a requirement for more data and this is computationally expensive.

"Impedance Observer for a Li-Ion Battery Using Kalman Filter" (IEEE Transactions on Vehicular Technology, Vol. 58, No. 8, October 2009, pages 3930-3937) describes the use of an extended Kalman filter in conjunction with a so-called "lumped" model of battery cells in order to estimate the SoC and State of Health (SoH) of a Lithium Ion battery.

SUMMARY OF THE INVENTION

The present invention provides a cell monitoring apparatus, a battery monitoring apparatus, an integrated circuit and a method of monitoring a rechargeable cell as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION OF THE PREFERRED EMBODIMENTS

Figure 1:
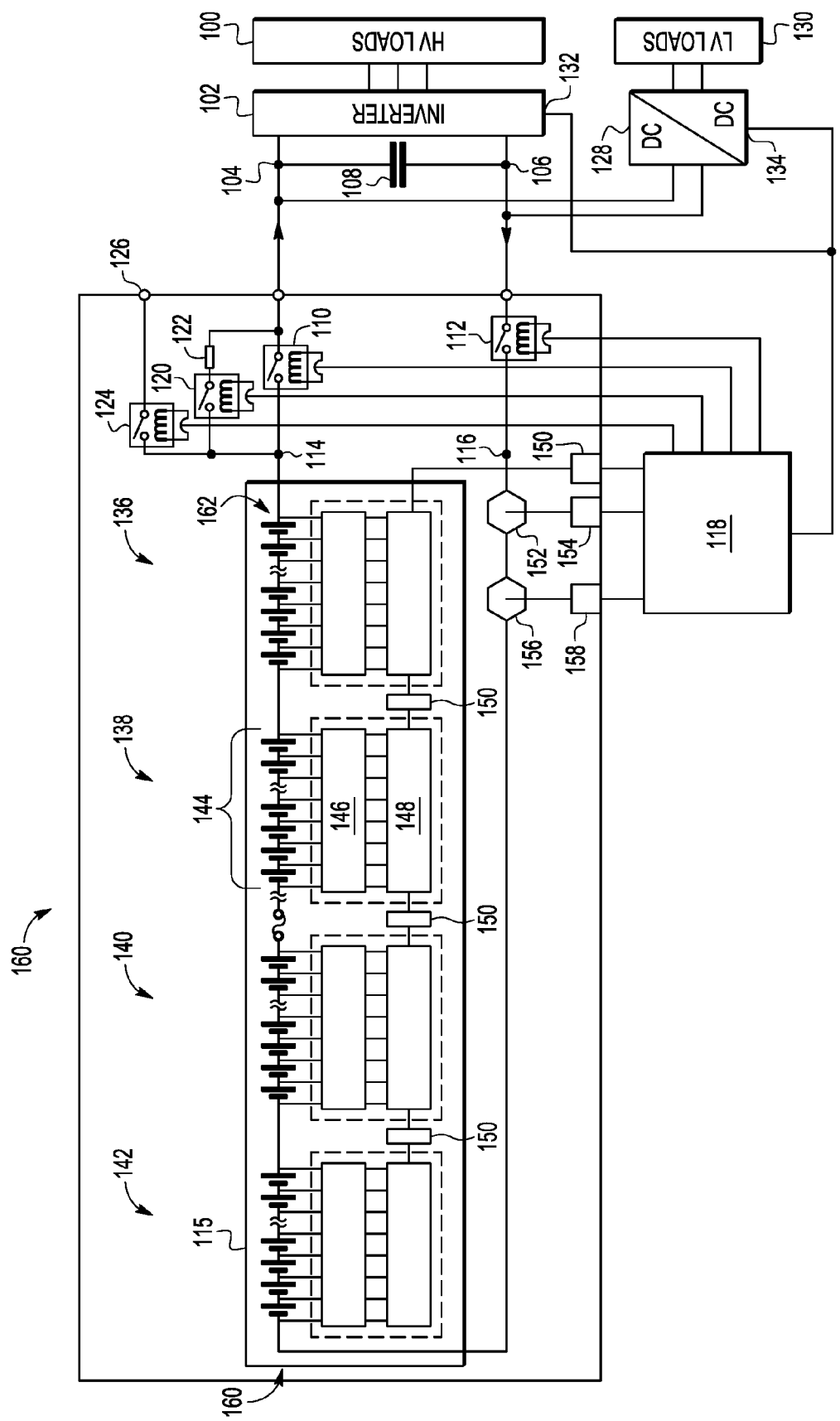
FIG. 1 is a schematic block diagram of a system architecture of an automotive vehicle.

Because the illustrated examples may for the most part, be implemented using electronic components and circuits known to those skilled in the art, details will not be explained in any greater extent than that considered necessary, for the understanding and appreciation of the underlying concepts of the examples set forth herein and in order not to obfuscate or distract from the teachings herein.

According to a first example, there is provided a cell monitoring apparatus that may comprise: a memory to store input state data representing initial parameters for estimating parameters of a rechargeable cell; a processor operably coupled to the memory and supporting an estimator unit to receive, when in use, the input state data; wherein the processor and the memory are arranged to execute code representing a linear time-invariant state transition model and a non-linear observation model modelling the rechargeable cell using at least a non-linear open circuit voltage, an internal resistance, a time-invariant distortion voltage across a reactive component block, and a distortion current component constituting an error in respect of measurement of current flowing through the reactive component block; the estimator unit for performing extended Kalman filtering in respect of the state transition model and the observation model using the input state data in order to generate output state data; and the processor is arranged to evaluate a criterion associated with at least part of the output state data and to generate, when in use, a control signal in response to evaluation of the criterion.

The memory may be arranged to store look-up data representing a correlation between the open circuit voltage of the rechargeable cell and the State of Charge of the rechargeable cell.

The estimator unit may be arranged to estimate the open circuit voltage using an estimated State of Charge obtained from the output state data and the stored look-up data.

The estimator unit may be arranged to calculate a terminal voltage of the rechargeable cell using the estimate of the open circuit voltage.

The estimator unit may be arranged to estimate the internal resistance of the rechargeable cell using the output state data.

The estimator unit may be arranged to estimate a predicted covariance using variables of a state equation treated as a matrix and corresponding to the state transition model, the variables of the state equation treated as the matrix serving as the Jacobian matrix of the state equation treated as the matrix.

The non-linear observation model may be represented by the equation:

$$V_t = OCV(\sigma) - RI - RI_d - V_d$$

where $V_t$ may be a measured voltage, $OCV(\sigma)$ is an open circuit voltage in respect of a State of Charge of the rechargeable cell, R may be an internal resistance of the rechargeable cell, I is a measured current, $I_d$ may be a distortion current component, and $V_d$ may be a distortion voltage component.

An initial value of a state estimation, $\bar{x}_0$ constituting the input state data may be determined by performing an operation that can be described by the equation:

$$\bar{x}_0 = \begin{pmatrix} \Phi^{-1}(OCV) \\ R_0 \\ 0 \\ 0 \end{pmatrix}$$

where $\Phi^{-1}(\ )$ may be an inverse of a monotonic relationship between the open circuit voltage and the state of charge of the rechargeable cell, and $R_0$ may be an initial internal resistance.

An initial value of a state estimation, $\bar{x}_0$, constituting the input state data may be determined by performing an operation that can be described by the equation:

$$\bar{x}_0 = \begin{pmatrix} \Phi^{-1}(V - V_{d,end} \cdot e^{-\Delta t_{end}/\tau}) \\ R_{end} \\ V_{d,end} \cdot e^{-\Delta t_{end}/\tau} \\ 0 \end{pmatrix}$$

where $\Phi^{-1}(\ )$ may be an inverse of a monotonic relationship between the open circuit voltage and the State of Charge of the rechargeable cell, V is a measured voltage, $\Delta t_{end}$ may be an elapse of time since the last error-free use of the extended Kalman filter, $R_{end}$ may be the last recorded internal resistance, $V_{d,end}$ may be the last recorded distortion voltage component and $\tau$ may be a cell relaxation time constant based upon battery temperature.

According to a second example, there is provided a battery monitoring apparatus that may comprise the cell monitoring apparatus as set forth in accordance with the first example, and may further comprise: a cell data selection unit arranged to receive open circuit voltage data in respect of a plurality of rechargeable cells of a battery, the cell data selection unit being arranged to select the rechargeable cell from amongst the plurality of rechargeable cells, the rechargeable cell having the lowest open circuit voltage of the plurality of rechargeable cells.

The cell data selection unit may be arranged to select another rechargeable cell from amongst the plurality of rechargeable cells; the another rechargeable cell may have the highest open circuit voltage of the plurality of rechargeable cells.

The estimator unit may be arranged to evaluate the criterion in respect of the cell having the lowest open circuit voltage and in respect of the cell having the highest open circuit voltage.

The estimator unit may be arranged to calculate an arithmetic mean in respect of the cell having the lowest open circuit voltage and in respect of the cell having the highest open circuit voltage in order to evaluate the criterion.

The criterion may be the State of Charge of the battery.

According to a third example, a powertrain for a vehicle may comprise the cell monitoring apparatus as set forth above in relation to the first example.

The powertrain may further comprise a cell measurement unit capable of providing a cell voltage measurement; the estimator unit may be arranged to use the cell voltage measurement.

The cell measurement unit may be arranged to measure cell temperature.

According to a fourth example, a vehicle may comprise the cell voltage estimation apparatus as set forth above in relation to the first example.

According to a fifth example, an integrated circuit may comprise the battery monitoring apparatus as set forth above in relation to the second example and/or the cell monitoring apparatus as set forth above in relation to the first example.

According to a sixth example, there is provided a method of monitoring a rechargeable, the method may comprise: storing input state data representing initial parameters for estimating parameters of the rechargeable cell; retrieving the input state data; modelling the rechargeable cell as a linear time-invariant state transition model and a non-linear observation model using at least a non-linear open circuit voltage, an internal resistance, a time-invariant distortion voltage across a reactive component block, and a distortion current constituting an error in respect of measuring current flowing through the reactive component block; executing code representing the linear time-invariant state model and the non-linear observation model; executing an extended Kalman filter in respect of the state transition model and the observation model using the input state data in order to generate output state data; and evaluating a criterion associated with at least part of the output state data and generating a control signal in response to evaluation of the criterion associated with at least part of the output state data.

Referring now to FIG. 1, the electrical aspects of a powertrain of an electrically powered vehicle or hybrid electric vehicle comprise a High Voltage (HV) load 100, for example a three phase electric motor, the HV load 100 being electrically coupled to an inverter 102. The inverter 102 may have a positive terminal 104 and a negative terminal 106 and a capacitor 108 may be coupled across the positive and negative terminals 104, 106. A first terminal of a positive-side contactor 110 may also be coupled to the positive terminal 104 and a first terminal of a negative-side contactor 112 may be coupled to the negative terminal 106. A second terminal of the positive-side contactor 110 may be coupled to a positive terminal 114 of a battery pack 115 and a second terminal of the negative-side contactor 112 may be coupled to a negative terminal 116 of the battery pack 115. A control terminal of the positive-side contactor 110 may be coupled to a battery pack controller 118 and a control terminal of the negative-side contactor 112 may also be coupled to the battery pack controller 118.

A pre-charge contactor 120 may have a first terminal that may be coupled to the positive terminal 104 via a resistance 122, a second terminal of the pre-charge contactor 120 being coupled to the positive terminal 114 of the battery pack 115 and a control terminal of the pre-charge contactor 120 being coupled to the battery pack controller 118. Optionally, a charger contactor 124 may be provided for plug-in hybrid vehicles and may have a first terminal coupled to a vehicle-side charging socket 126 and a second terminal coupled to the positive terminal 114 of the battery pack 115. A control terminal of the charger contactor 124 may be coupled to the battery pack controller 118.

A step-down DC-DC transformer 128 may be coupled across the positive and negative terminals 104, 106; the transformer 128 may be coupled to low voltage (LV) loads 130 of the vehicle, for example lights or windscreen wipers. A control terminal 132 of the inverter 102 and a control terminal 134 of the transformer 128 may both be coupled to the battery pack controller 118.

The battery pack 115 may comprise a number of cell blocks, for example a first cell module (or cluster) 136, a second cell module 138, a third cell module 140 and a fourth cell module 142. The first, second, third and fourth cell modules 136, 138, 140, 142 may be coupled in series between the positive terminal 114 of the battery pack 115 and the negative terminal 116 of the battery pack 115. Each cell module 136, 138, 140, 142 may comprise a plurality of series-coupled cells 144, sometimes referred to as "stacks". Each plurality of cells 144 may be coupled to cell balancing circuitry 146, the cell balancing circuitry 146 being coupled to a respective measurement unit 148. In this example, the cell balancing circuitry 146 and the measurement unit 148 are formed as an integrated circuit. For increased safety and reliability, an isolator 150 may be coupled between adjacent measurement units 148. The series-coupled measurement units 148 may be coupled to the battery pack controller 118 via one of the isolators 150.

A primary current sensor 152 may also be coupled to the battery pack controller 118 via another isolator 154 and a secondary, backup, current sensor 156 may be coupled to the battery pack controller 118 via a further isolator 158. A first terminal of the primary current sensor 152 may be coupled to the negative terminal 116 and a second terminal of the primary current sensor 152 may be coupled to a first terminal of the secondary current sensor 156. A second terminal of the secondary current sensor 156 may be coupled to a first side 160 of the battery pack 115 and a second side 162 of the battery pack 115 may be coupled to the positive terminal 114 as described above.

Figure 2:
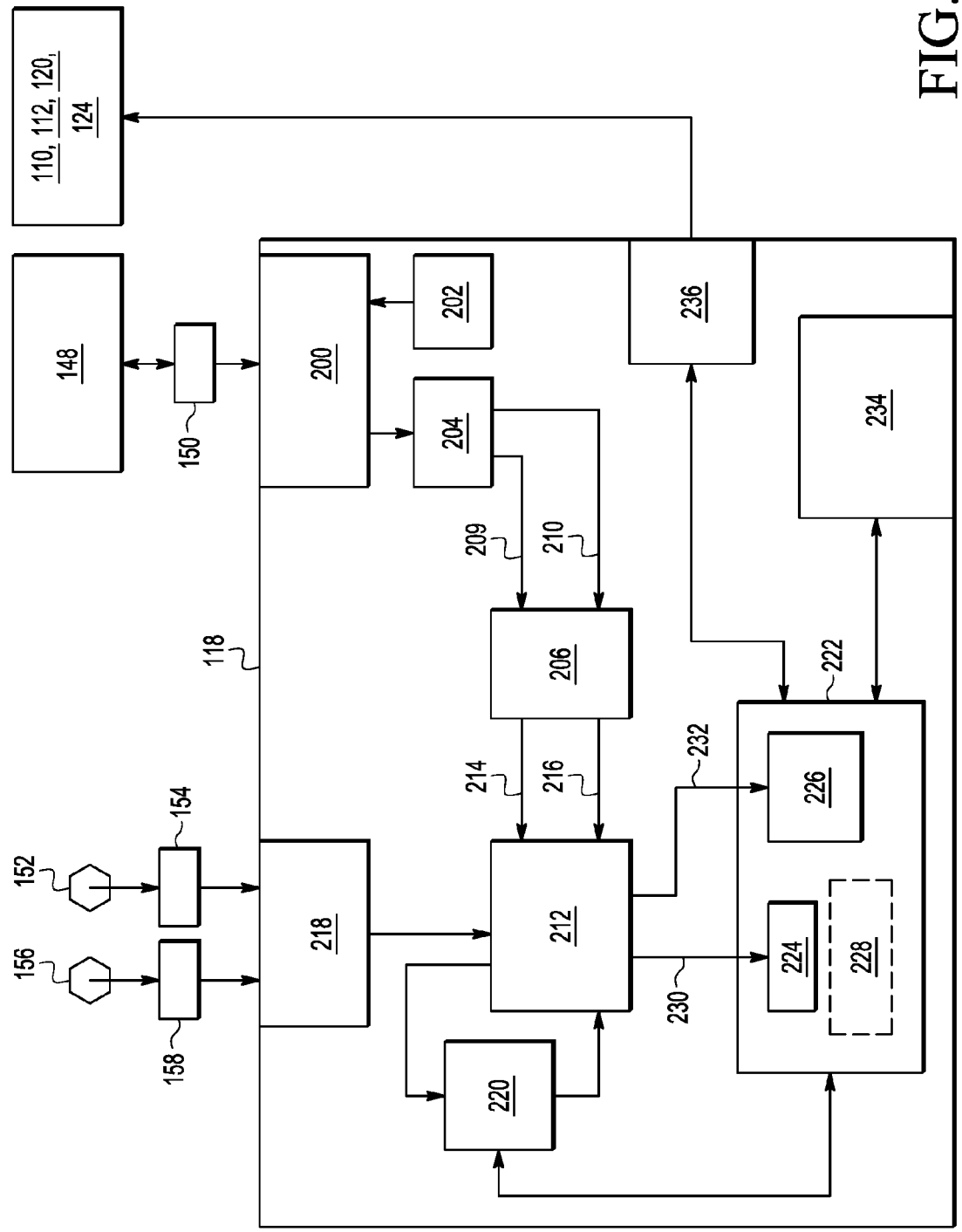
FIG. 2 is a schematic block diagram of a battery pack controller of FIG. 1 in greater detail comprising a cell monitoring apparatus constituting an example of the present invention.

Turning to FIG. 2, the battery pack controller 118 constituting a cell monitoring apparatus may be operably coupled to the daisy-chained measurement units 148 via one of the isolators 150 as described above. The measurement units 148 may be coupled to an intra-system transceiver 200, the transceiver 200 being coupled to a transmission buffer 202 and a reception buffer 204. The reception buffer 204 may be coupled to a critical cell selection unit 206 via a first cell voltage data path 208 and a separate parallel first cell temperature data path 210. The cell section unit 206 may be coupled to an estimator unit 212 constituting, inter alia, a cell voltage estimation apparatus via a second cell voltage data path 214 and a separate parallel second cell temperature data path 216.

The primary current sensor 152 and the secondary current sensor 156 may be coupled to a current sensor processing unit 218 via the another isolator 154 and the further isolator 158, respectively, the current sensor processing unit 218 being coupled to the estimator unit 212. A non-volatile memory unit 220 may also be coupled to the estimator unit 212 and a battery management unit 222. The battery management unit 222 may comprise a state of health evaluation module 224, an energy and power limits evaluation unit 226 and a further data processing unit 228. The further data processing unit 228 may perform one or more of the following data processing operations: cell supervision, including charge balancing of all cells of the battery pack 115, cell balancing diagnosis, cell minimum-maximum voltage classification, cell minimum-maximum temperature classification; calculation and report of battery relative capacity; calculation and report of battery charge efficiency; calculation and report of battery state of function (SOF); contactor control and diagnosis (including watchdog functions for a main contactor interrupt); contactor welded diagnosis; active discharge detection; High Voltage Interlock Loop (HVIL) control and state determination; High Voltage bus short detection; High Voltage bus open cable detection; High Voltage bus-chassis Isolation detection; High Voltage bus voltage determination; High Voltage bus capacitive pre-charging; battery voltage plausibility checking; battery temperature; plausibility checking; battery voltage plausibility check; measure, monitors and reports in and out coolant temperature; cooling system controls; moisture detection; smoke detection; calculation of elapsed time; freeze frame data storing for any failure mode, DID (data identifiers) service tool accessing at all freeze frame data stored; service tool activating all functionalities; and/or service using Seed and Key for reprogramming the designated DIDs in service operations. However, the further data processing unit 228 is mentioned only for the sake of completeness and so in order not to distract from the core teachings of the examples set forth herein, further details of the further data processing unit 228 will not be described.

The battery management unit 222 may also be coupled to the estimator unit 212. In particular, the estimator unit 212 may be operably coupled to the state of health evaluation module 224 via an estimated internal resistance data path 230 and to the energy and power limits evaluation unit 226 via a separate, parallel, state of charge data path 232. The battery management unit 222 may be further coupled to another intra-system transceiver unit 234, which may be coupled (although not shown) to other system components, for example the invertor 102 and the step-down DC-DC transformer 128. The battery management unit 222 may also be coupled to a contactor actuation and diagnostics unit 236, which may be coupled to the positive-side contactor 110, the negative-side contactor 112, the pre-charge contactor 120 and the charger contactor 124 as described above.

Figure 3:
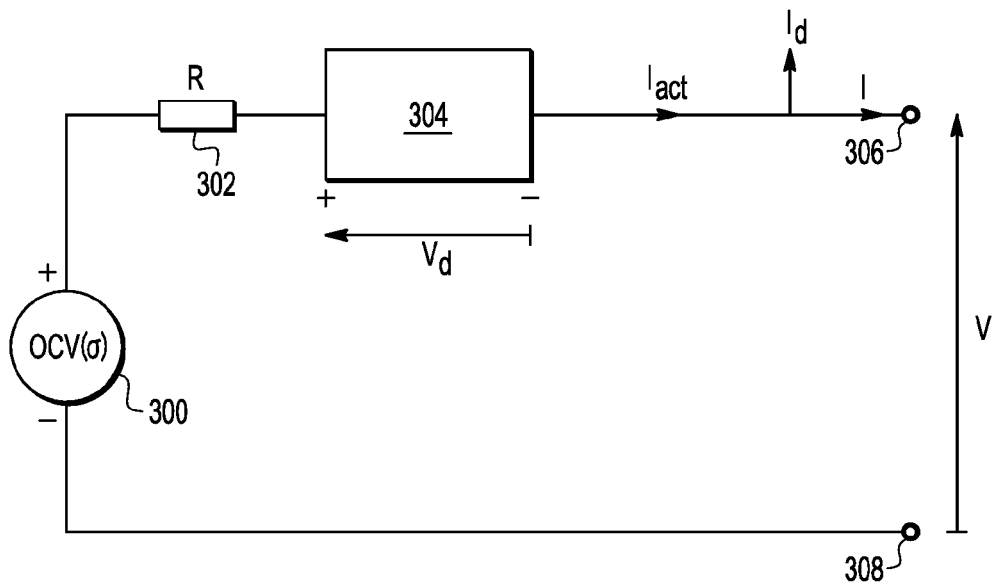
FIG. 3 is a schematic block diagram of a model of a battery pack used by the cell voltage estimation apparatus of FIG. 2.

In relation to operation of the battery pack controller 118, and estimating a current drawn in respect of a cell of the battery and an internal resistance, R, of the battery, the following electrical model of the battery has been conceived. Referring to FIG. 3, the battery may have an Open Circuit Voltage (OCV) modelled as a voltage source 300 that may be dependent upon a State of Charge (SoC), σ, of the battery. The battery may have an internal resistance, R, 302 that is modelled as connected in series with the voltage source 300. Additionally, the unknown (precisely) reactive components of the battery may be modelled as a voltage drop 304. A measured voltage, V, and a measured current, I, may be assumed to be measurable across measurement terminals 306, 308. However, as a result of the existence of the voltage drop 304, the measured current and voltage, I, V, may be distorted from the actual OCV and the actual current, $I_{act}$, flowing through the battery. As such, the actual current, $I_{act}$, can be perceived as being composed of the measured current, I, and a current distortion component, $I_d$, constituting an error in measuring current flowing through the reactive component(s), i.e.

$$I = I_{act} + I_d \quad (1)$$

The internal resistance, R, may be assumed to be an ohmic component dependent upon the temperature of the bulk of the cell of the battery and the SoC of the cell of the battery. The internal resistance may be assumed to vary sufficiently slowly that the first derivative of the internal resistance with respect to time may be approximated to zero with negligible noise that can also be approximated to zero. Consequently, the internal resistance, R, may be assumed to be constant.

The voltage drop 304 is treated as a distortion voltage component, $V_d$. It may be assumed that the distortion voltage component, $V_d$, varies slowly with time and so the distortion voltage component can be modelled as a constant value, i.e. the first derivative of the distortion voltage component with respect to time may be assumed to be zero.

The model of FIG. 3 can be used to derive an expression for the measured voltage, V, at a given time, t:

$$V_t = OCV(\sigma_t) - R_t I_t + R_t I_{d,t} - V_{d,t} \quad (2)$$

where: $\sigma_t$ is the SoC of the cell of the battery at the time, t; $R_t$ is the internal resistance of the cell of the battery at the time, t; $I_{d,t}$ is the current distortion component at the time, t; and $V_{d,t}$ is the voltage distortion component at the time, t.

In a discrete time domain, as the internal resistance, R, can be assumed to be constant, the internal resistance, $R_{t+1}$, at a subsequent time, t+1, can be expressed as:

$$R_{t+1} = R_t \quad (3)$$

Similarly, the distortion current component, $I_{d,t+1}$, at the subsequent time, t+1, can be expressed as:

$$I_{d,t+1} = I_{d,t} \quad (4)$$

The voltage distortion component, $V_{d,t+1}$, at the subsequent time, t+1, can be expressed as:

$$V_{d,t+1} = V_{d,t} \quad (5)$$

The SoC, $\sigma_{t+1}$, at the subsequent time, t+1, may be based upon the sum of the SoC at the time, t, and a percentage component associated with the change of the SoC. This can be expressed as:

$$\sigma_{t+1}[\%] = \sigma_t + \frac{Q_{act}}{Q_{max}} \times \frac{100}{1} \quad (6)$$

where: $Q_{max}$ is the maximum charge of the cell of the battery; and $Q_{act}$ is the actual charge flowing in the cell of the battery. $Q_{act}$ can be expressed in terms of the actual current and a time step, $\Delta t$:

$$\sigma_{t+1}[\%] = \sigma_t - \frac{I_{act} \Delta t}{Q_{max}} \times \frac{100}{1} \quad (7)$$

However, substituting expression (1) into (7) above, yields:

$$\sigma_{t+1} = \sigma_t + \frac{(I_{d,t} - I_t) \Delta t}{Q_{max}} \times \frac{100}{1} \quad (8)$$

Equations (3), (4), (5) and (8) can be rewritten in matrix/vector form:

$$\begin{pmatrix} \sigma_{t+1} \\ R_{t+1} \\ V_{d,t+1} \\ I_{d,t+1} \end{pmatrix} = \begin{pmatrix} 1 & 0 & 0 & \frac{100 \Delta t}{Q_{max}} \\ 0 & 1 & 0 & 0 \\ 0 & 0 & 1 & 0 \\ 0 & 0 & 0 & 1 \end{pmatrix} \cdot \begin{pmatrix} \sigma_t \\ R_t \\ V_{d,t} \\ I_{d,t} \end{pmatrix} + \begin{pmatrix} \frac{-100 \Delta t}{Q_{max}} \\ 0 \\ 0 \\ 0 \end{pmatrix} \cdot I_t \quad (9)$$

Using generic notation used in relation to extended Kalman filters, the following substitutions can be made:

$$u_t = I_t$$

$$x_t = [\sigma_t, R_t, V_{d,t}, I_{d,t}]^T$$

$$y_t = V_t$$

where $u_t$ is an input sequence of the system being modelled, for example the current values, $x_t$ is a state vector, and $y_t$ is an output sequence of the system being modelled, for example the terminal voltage values.

Equation (9) above is a state model (in the form of an equation) upon which an extended Kalman filter is based and equation (2) is an output or observation model (in the form of an equation) upon which the extended Kalman filter is based, and can be expressed as follows:

$$x_{t+1} = f(x_t, u_t) = A_t x_t + B_t u_t \quad (10)$$

$$y_t = h(x_t, u_t) = OCV(x_{1,t}) - x_{2,t} u_t + x_{2,t} x_{4,t} - x_{3,t} \quad (11)$$

where: $A_t$ and $B_t$ may be the following substitutions from equation (9) above:

$$A_t = \begin{pmatrix} 1 & 0 & 0 & \frac{100 \Delta t}{Q_{max}} \\ 0 & 1 & 0 & 0 \\ 0 & 0 & 1 & 0 \\ 0 & 0 & 0 & 1 \end{pmatrix},$$

and $$B_t = \begin{pmatrix} \frac{-100 \Delta t}{Q_{max}} \\ 0 \\ 0 \\ 0 \end{pmatrix}$$

When performing an extended Kalman filter, the non-linear equations may be linearised. This is done by calculating the Jacobian matrices for the non-linear equations. However, the state equation is linear and so the matrices $A_t$ and $B_t$ can be used as the Jacobian matrix $F_t$ in equation (18) set out later below, but the observation equation is non-linear and so the Jacobian matrix, $H_k$, of the function $h(x_t, u_t)$ may need to be calculated.

$$H_k = \frac{\partial h}{\partial x} \bigg|_{\hat{x}_{t|t-1}} = \begin{pmatrix} \frac{\partial h}{\partial x_1} & \frac{\partial h}{\partial x_2} & \frac{\partial h}{\partial x_3} & \frac{\partial h}{\partial x_4} \end{pmatrix} \quad (12)$$

$$= \left[ \left( \frac{\partial OCV}{\partial x_1} \right)_{x_{1,t|t-1}} \quad (x_{4,t} - u_t) \quad -1 \quad x_{2,t} \right]$$

As part of the extended Kalman filter, noise statistics may need to be known in respect of the model being employed and the value of the second order statistics relating to the error that affects the state vector, $x_t$, may need to be calculated. In this respect, let us consider the continuous time domain and first derivatives of continuous time domain equations corresponding to equations (3), (4), (5) and (8):

$$\dot{\sigma} = -\frac{100}{Q_{max}}(I - I_d) + v_1 \qquad (13)$$

$$\dot{R} = 0 + v_2 \qquad (14)$$

$$\dot{V} = 0 + v_3 \qquad (15)$$

$$\dot{I}_d = 0 + v_4 \qquad (16)$$

Also, equation (2) can be rewritten to include a measurement noise component, n.

$$V = OCV(\sigma) - R(I - I_d) - V_d + n \qquad (17)$$

As can be seen from equations (13), (14), (15), (16), each first derivative of a parameter state component of the model has a process noise component, $v_1$, $v_2$, $v_3$, $v_4$. The process noise components, however, may have zero mean. Similarly, the measurement noise component of equation (17) may have a zero mean. The process noise components can be expressed as a vector of process noise components.

$$v = \begin{pmatrix} v_1 \\ v_2 \\ v_3 \\ v_4 \end{pmatrix}$$

In order to perform the extended Kalman filter, the autocorrelation of the process noise component may need to be found, which is:

$$Q = \Delta t^2 E[vv^T]$$

Also, the autocorrelation of the measurement noise component may also need to be calculated:

$$R_0 = \Delta t^2 E[n^T n]$$

With the above noise statistics and linear state and observation equations determined, the extended Kalman filter process can be executed based upon the following generic equations.

$$\bar{x}_{t|t-1} = f(\bar{x}_{t-1}, u_{t-1}) = A_{t-1}\bar{x}_{t-1} + B_{t-1}u_{t-1} \qquad (18)$$

$$\bar{y}_t = h(\bar{x}_{t|t-1}, u_t)$$

Figure 4:
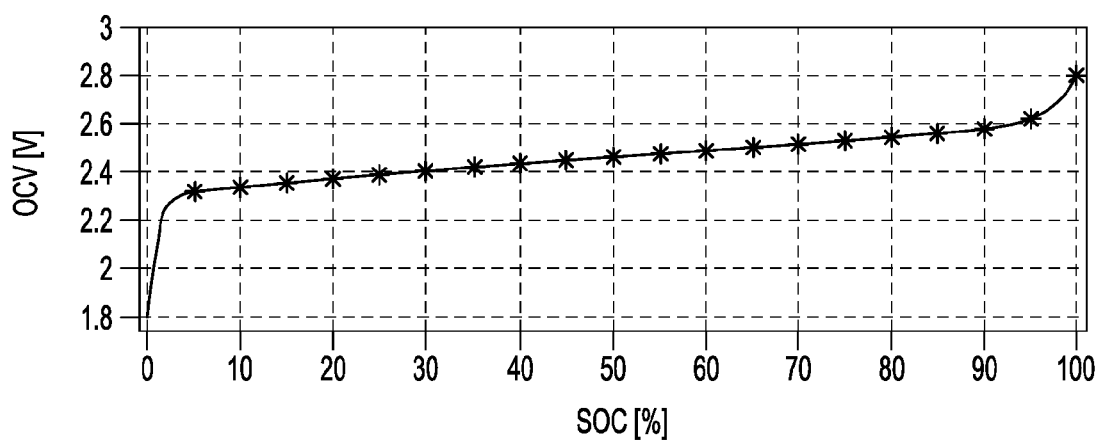
FIG. 4 is a flow diagram of a method of monitoring a rechargeable cell used by the cell voltage monitoring apparatus of FIG. 2 and constituting another example of the invention.

In operation (FIG. 4), the following procedure may be executed in a manner to determine a minimum SoC value and a maximum SoC value in order to determine an SoC value for the whole battery pack 115.

In a first example, the system may be powered up for the first time or the integrity of data stored in the non-volatile memory unit 220 may not be reliable. Consequently, when evaluating (Block 400) the initial values of $\bar{x}$, hereafter referred to as $\bar{x}_0$, and the covariance matrix, P, hereinafter referred to as $P_0$, the initial value $\bar{x}_0$ is set to:

$$\bar{x}_0 = \begin{pmatrix} \Phi^{-1}(v) \\ R_0 \\ 0 \\ 0 \end{pmatrix}$$

where $\Phi^{-1}$ is the inverse of a monotonic function OCV( ) that yields an SoC value for a given voltage, v. As will become apparent later herein, the estimator unit 212 is arranged to determine a minimum SoC value and a maximum SoC value associated with a most charged cell and a least charged cell using the model described above. As such, initial values of $\bar{x}_0$ are provided in respect of the least charged cell and the most charged cell.

The initial state values of the covariance matrix, $P_0$, can be arranged as a diagonal matrix. In this example, the initial values of the covariance matrix can be guessed, for example as described in "Extended Kalman Filter Tuning in Sensorless PMSM Drives" (Bolognani et al., Proceedings of the Power Conversion Conference, 2002, Osaka, pages 276-281), because the choice of the values of the covariance matrix, $P_0$, is not critical, because transient and steady-state conditions are unaffected.

The estimator unit 212 may load the initial value of the state equation, $\bar{x}_0$, from the non-volatile memory 220.

As part of the battery monitoring process, the transceiver 200 may receive data from the battery measurement units 148; the data may be received in a message format and the transceiver 200 extracts measurement data from communications-related encoding of the messages, for example headers and/or other encapsulation, and may store the measurement data, for example cell terminal voltages and respective cell temperatures, in the reception buffer 204. The cell terminal voltages and respective cell temperatures may then be communicated to the cell selection unit 206 for processing. In this example, the voltages and temperatures of the most charged cell and least charged cell are selected by the cell selection unit 206 from the cell terminal voltages and cell temperatures received and may be passed to the estimator unit 212 in order to determine the minimum SoC value and the maximum SoC value. The noise statistics, in this example autocorrelation matrices, are also evaluated for the current time (Block 402). The following processing is then performed in respect of the least charged cell and the most charged cell identified by the cell selection unit 206. However, for the sake of conciseness of description, processing will usually only be described herein in the context of determining an SoC value in general as the principle applies to maximum and minimum SoC values.

A time counter, t, stored in the non-volatile memory 220 may then be incremented by unity (Block 404) by the estimator unit 212. In accordance with the extended Kalman filter technique, the estimator unit 212 then predicts (Block 406) a state estimate with respect to the state equation as set forth in equation (10) above. The estimator unit 212 may also predict (Block 406) a covariance estimate with respect to the state equation. As the state equation is linear, there is no need to calculate the Jacobian matrix in respect of the state equation mentioned above. In order to generate the state estimate and the covariance estimate, the matrices $A_t$, $B_t$, may be loaded (Block 408) from the non-volatile memory 220 by the estimator unit 212. In this example, the estimator unit 212 calculates the covariance estimate using the following equation:

$$P_{t|t-1} = A_t P_{t-1} A_t^T + Q_t \qquad (19)$$

The estimator unit 212 may then proceeds to the update phase of the extended Kalman filter (Block 410) and may calculate a measurement residual using the following equation:

$$\tilde{y}_t = y_t - \bar{y}_t = y_t - h(\bar{x}_{t|t-1}, u_{t-1}) \quad (20)$$

The estimator unit 212, as part of the update phase, may also calculate a residual covariance using the following equation:

$$S_t = H_t P_{t|t-1} H_t^T + R_{0,t} \quad (21)$$

The residual covariance may then be used by the estimator unit 212 to calculate a near-optimal Kalman gain using the following equation:

$$K_t = P_{t|t-1} H_t^T S_t^{-1} \quad (22)$$

Thereafter, an updated state estimate and an updated covariance estimate can be calculated as part of the update process as follows. The updated state estimate may be calculated by the estimator unit 212 using the following equation and the gain calculated above using equation (22):

$$\bar{x}_t = \bar{x}_{t|t-1} + K_t \tilde{y}_t$$

where: $\tilde{y}_t$ may be the measurement residual calculated using equation (20) above. The updated covariance estimate may be calculated by the estimator unit 212 using the following equation:

$$P_t = P_{t|t-1} - K_t H_t P_{t|t-1}$$

Figure 5:
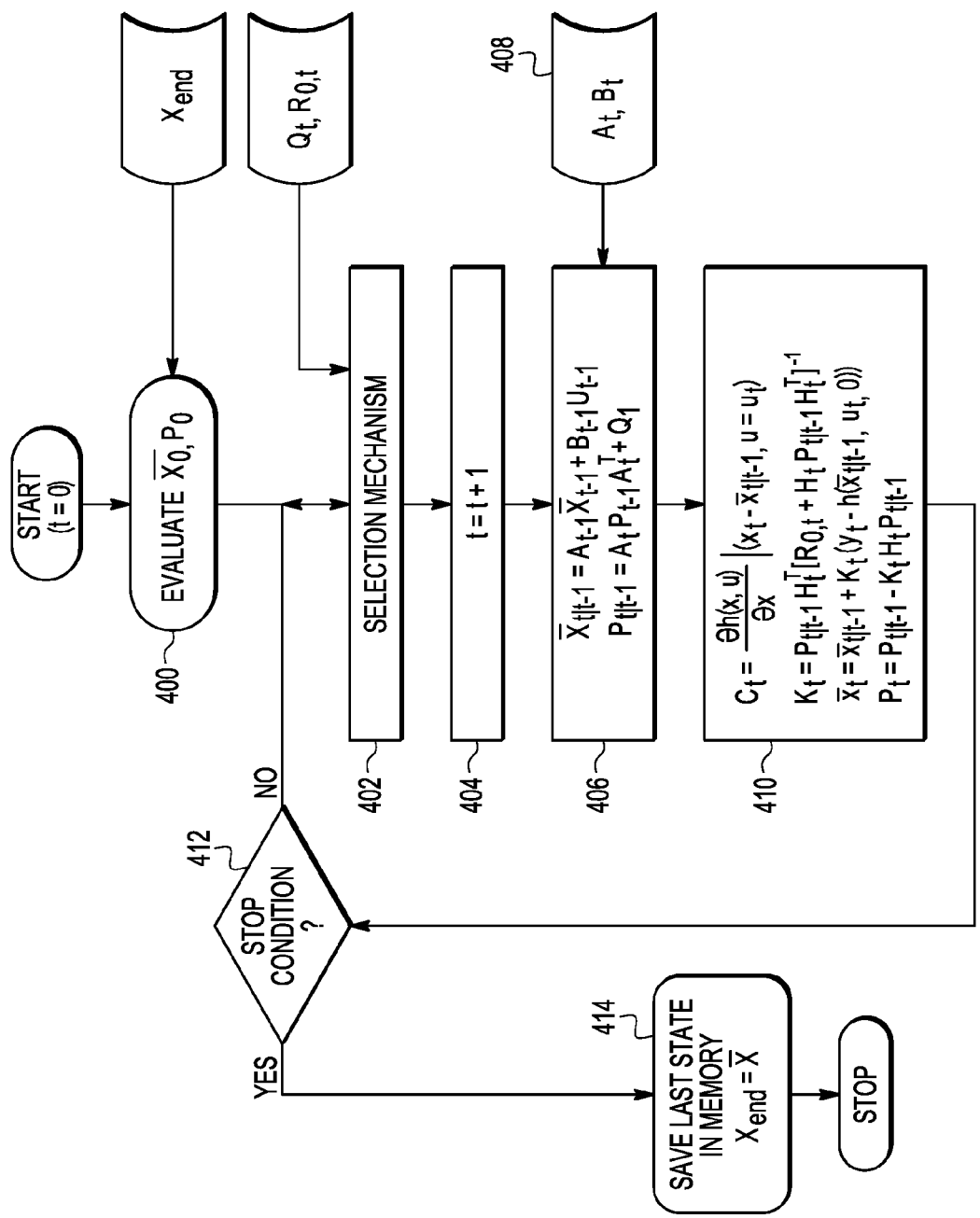
FIG. 5 is a graph of open circuit voltage vs. state of health of the battery pack used by the cell monitoring apparatus of FIG. 2.

Once an updated state estimate, $\bar{x}_t$, has been obtained, the estimated SoC, $\bar{\sigma}$, may be used in conjunction with the function OCV( ) in order to determine the estimated OCV for the estimated SoC, $\bar{\sigma}$. In this respect, the relationship between the SoC of the cell and the OCV is a known characteristic, for example the characteristic of FIG. 5, and is stored in the non-volatile memory 220, for example as a look-up table. The estimator unit 212 may therefore access the look-up table and determine the estimated OCV of the cell for the estimated SoC values calculated, i.e. minimum SoC value and maximum SoC value. In respect of each of the minimum SoC and maximum SoC value, the terminal voltage V may be calculated using the updated values for $R_t$, $V_{d,t}$, and $\underline{I}_{d,t}$, extracted from the respective updated state estimate, $\bar{x}_t$, the estimated OCV, and equation (17). Once determined, the OCV can be used to determine the SoC of the battery pack 115. The estimator unit 212, having performed the above processing in respect of the most and least charged cells, may have values of a minimum SoC and a maximum SoC. In order to determine the SoC value for the battery pack 115, the estimator unit 212 may calculate an arithmetic mean of the minimum SoC value and the maximum SoC value. This arithmetic mean is calculated, because when discharging the battery pack 115, the limiting factor is the minimum SoC value and when charging the battery pack 115, the limiting factor is the maximum SoC value. To this end, as the cells are connected in series, the minimum and maximum SoC values of the individual selected cells are equivalent to minimum and maximum SoC values of the battery pack 115 and so may need to be monitored and this can be achieved in combination by using the arithmetic mean of the minimum and maximum SoC values.

Once the SoC of the battery pack 115 has been determined, the estimator unit 212 then passes the estimated SoC value and the updated internal resistance value to the energy and power limits evaluation module 226 and the state of health evaluation module 224, respectively.

Using the estimated SoC value and the updated internal resistance value obtained from the estimator unit 212, the battery management function unit 222 determines (Block 412) whether the state of health of the battery pack is within acceptable limits and whether the long and short-term energy and power limits of the battery pack are acceptable. In this respect, at the end of each iteration of this process, the estimator unit 212, stores, for each estimated SoC and temperature, the updated internal resistance in a two-dimensional look-up table in the non-volatile memory 220. A reference internal resistance value, $R_{ref}$, corresponding to an internal resistance of a new cell is also stored in the non-volatile memory 220. The reference internal resistance, $R_{ref}$, is obtained upon first use of the battery pack 115. As such, a cell with an internal resistance, R, equal to the reference internal resistance, $R_{ref}$, is healthy, whereas a cell with an internal resistance that is, for example, 20% greater than the referenced internal resistance, $R_{ref}$, is "dead". In relation to the long and short term energy and power limits of the battery pack, the battery pack controller 118 may need to communicate, inter alia, the minimum and maximum power that can be drawn from the battery and delivered to the battery in order not to damage the battery. This may require knowledge of the OCV. However, for the sake of clarity and conciseness, this aspect of the functionality of the battery pack controller 118 will not be described further, because the functionality is not core to the teachings of the embodiments set forth herein. As a result of either of these determinations, if it may be necessary to shut the system down the battery management function unit 222 instructs the contactor actuation and diagnostics unit 236 to disconnect the battery pack from the HV and LV loads 100, 130.

Thereafter, the estimator unit 272 may store (Block 414) the last calculated updated state estimate, $\bar{x}_t$, in the non-volatile memory 220 ($x_{end}$). Alternatively, the system may be voluntarily shut down, for example at the end of a journey, in which case the last calculated state estimate is also stored in the non-volatile memory 220 ($x_{end}$).

Additionally, over time, nominal measured current $I_{nom}$, values and the associated distortion current, $I_d$, can be stored in the non-volatile memory 220, thereby enabling a correction factor function, to be learnt and used. The measured current I, can then be calculated by the estimator unit 212 with greater accuracy using the function:

$$I = I_{nom} + g(t, I_{nom})$$

where g( ) is the learnt function mentioned above.

In this respect, prior to commencement of the learning of the correction factor function, the estimator unit 212 initialises the function $g(t, I_{nom})$ to $g(t, I_{nom})=0$ in the non-volatile memory 220 for all values of $I_{nom}$. Thereafter, the correction factor function, g( ), is determined using the following expression:

$$g(t, I_{nom}) = g(t-1, I_{nom}) + \mu \cdot I_d$$

where $\mu$ is a constant between 0 and 1 ($0 < \mu << 1$), known as a "learning factor". In response to calculation of estimates of the distortion current, $I_d$, by the estimator unit 212, the estimator unit 212 uses the estimates of the distortion current, $I_d$, the correction factor, $\mu$, and an immediately previous evaluation of the correction factor function, $g(t-1, I_{nom})$, in order to calculate an updated correction factor function value, which is stored in the non-volatile memory 220. As mentioned above, through learning the correction factor function g( ) values, the measured current, I, can be determined. It should be noted that even if the nominal measured current, $I_{nom}$, is affected by measurement errors, it will converge towards $I=I_{nom}+I_d$ over time. The distortion current, $I_d$, can also be stored in the non-volatile memory 220 at the end of each journey and re-loaded for use during subsequent journeys.

If it is not necessary to shut the system down, the above process continues using the extended Kalman filter to generate updated state estimates (Blocks 402 to 412).

In another example, if the system is not being powered up for the first time or a memory error does not exist, the evaluation of the starting state is achieved by the estimator unit 212 loading the last recorded state estimate, $x_{end}$, from the non-volatile memory 220 and evaluating the time that has elapsed $\Delta t_{end}$ from the last termination of the above process. The estimator unit 212 then determines a battery relaxation time constant, $\tau$, as a function of a temperature of the battery, $T_{batt}$, which is empirically derived in advance and stored in the non-volatile memory 220. The elapsed time, $\Delta t_{end}$, and the relaxation time constant, $\tau$, are then used in the following expression to determine the initial state estimate, $\bar{x}_0$.

$$\bar{x}_0 = H(x_{end}, y_0) = \begin{pmatrix} \Phi^{-1}(V - V_{d,end} \cdot e^{-\Delta t_{end}/\tau}) \\ R_{end} \\ V_{d,end} \cdot e^{-\Delta t_{end}/\tau} \\ 0 \end{pmatrix}$$

Thereafter, once the initial state estimate, $\bar{x}_0$, is evaluated (Block 400), the remainder of the process of generating updated state estimates and responding, if necessary, to parameters determined using the update state estimates (Block 402 to 414), is performed in the manner already set forth above.

It is thus possible to provide a cell monitoring apparatus, a battery monitoring apparatus, an integrated circuit and a method of monitoring a rechargeable cell that results in improved current sensor precision (by virtue of the learnt current correction function mentioned above) as well as SoC estimation performance. Furthermore, the apparatus and method provide an improve basis for determining the SoH of the cell pack. The ability to compensate for current sensor errors enables safety procedures to be executed irrespective of current sensor errors and/or defects. Additionally, when used in a safety system, the outputs of redundant current sensors can be arbitrated. As such, a sensor having a lowest correction value can be selected for use. It is also possible to perform diagnostics on the internal state of a cell.

Of course, the above advantages are examples, and these or other advantages may be achieved by the examples set forth herein. Further, the skilled person will appreciate that not all advantages stated above are necessarily achieved by embodiments described herein.

In the foregoing specification, the invention has been described with reference to specific examples of embodiments of the invention. It will, however, be evident that various modifications and changes may be made therein without departing from the broader scope of the invention as set forth in the appended claims.

The embodiments may be implemented in a computer program for running on a computer system, at least including code portions for performing steps of a method according to the invention when run on a programmable apparatus, such as a computer system or enabling a programmable apparatus to perform functions of a device or system according to the embodiment.

A computer program is a list of instructions such as a particular application program and/or an operating system. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system, for example a batch file.

The computer program may be non-transitory and, for example, may be stored internally on computer readable storage medium. All or some of the computer program may be provided on a tangible computer readable storage medium permanently, removably or remotely coupled to an information processing system. The tangible computer readable media may include, for example and without limitation, any number of the following: magnetic storage media including disk and tape storage media; optical storage media such as compact disk media (e.g., CD-ROM, CD-R, etc.) and digital video disk storage media; nonvolatile memory storage media including semiconductor-based memory units such as FLASH memory, EEPROM, EPROM, ROM; ferromagnetic digital memories; MRAM; volatile storage media including registers, buffers or caches, main memory, RAM, etc.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. For example, blocks set forth in FIGS. 1 and 2 can be combined depending upon design convenience and the topology set forth in these figures is not intended to be limiting in any way.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

The examples set forth herein, or portions thereof, may be implemented as soft or code representations of physical circuitry or of logical representations convertible into physical circuitry, such as in a hardware description language of any appropriate type.

Also, the embodiments set forth herein are not limited to physical devices or units implemented in non-programmable hardware but can also be applied in programmable devices or units able to perform the desired device functions by operating in accordance with suitable program non-transitory code, such as mainframes, minicomputers, servers, workstations, personal computers, notepads, personal digital assistants, commonly denoted as 'computer systems'.

Other modifications, variations and alternatives to the examples set forth herein are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A cell monitoring apparatus comprising:
    a memory to store input state data representing initial parameters for estimating parameters of a rechargeable cell;
    a processor operably coupled to the memory and supporting an estimator unit to receive, when in use, the input state data; wherein
    the processor and the memory are arranged to execute code representing a linear time-invariant state transition model and a non-linear observation model modelling the rechargeable cell using at least a non-linear open circuit voltage, an internal resistance, a time-invariant distortion voltage across a reactive component block, and a distortion current component constituting an error in respect of measurement of current flowing through the reactive component block, wherein the non-linear observation model is represented by the equation:

$V_t = OCV(\sigma) - RI - RI_d - V_d$ where $V_t$ is a measured voltage, $OCV(\sigma)$ is an open circuit voltage in respect of a State of Charge of the rechargeable cell, R is an internal resistance of the rechargeable cell, I is a measured current, $I_d$ is a distortion current component, and $V_d$ is a distortion voltage component;
    the estimator unit configured to filter the state transition model and the observation model with an extended Kalman filter using the input state data in order to generate output state data; and
    the processor is arranged to evaluate a criterion associated with at least part of the output state data and to generate, when in use, a control signal in response to evaluation of the criterion, the control signal for control of the rechargeable cell.

2. The apparatus as claimed in claim 1, wherein the memory is arranged to store look-up data representing a correlation between the open circuit voltage of the rechargeable cell and the State of Charge of the rechargeable cell.

3. The apparatus as claimed in claim 2, wherein the estimator unit is arranged to estimate the non-linear open circuit voltage using an estimated State of Charge obtained from the output state data and the stored look-up data.

4. The apparatus as claimed in claim 3, wherein the estimator unit is arranged to calculate a terminal voltage of the rechargeable cell using the estimate of the non-linear open circuit voltage.

5. The apparatus as claimed in claim 1, wherein the estimator unit is arranged to estimate the internal resistance of the rechargeable cell using the output state data.

6. The apparatus as claimed in claim 1, wherein the estimator unit is arranged to estimate a predicted covariance using variables of a state equation treated as a matrix and corresponding to the state transition model, the variables of the state equation treated as the matrix serving as the Jacobian matrix of the state equation treated as the matrix.

7. The apparatus as claimed in claim 1, wherein an initial value of a state estimation, $\bar{x}_0$ constituting the input state data is determined by performing an operation that can be described by the equation:

$$\bar{x}_0 = \begin{pmatrix} \Phi^{-1}(OCV) \\ R_0 \\ 0 \\ 0 \end{pmatrix}$$

where $\Phi^{-1}(\ )$ is an inverse of a monotonic relationship between the open circuit voltage and the state of charge of the rechargeable cell, and $R_0$ is an initial internal resistance.

8. The apparatus as claimed in claim 1, wherein an initial value of a state estimation, $\bar{x}_0$, constituting the input state data is determined by performing an operation that can be described by the equation:

$$\bar{x}_0 = \begin{pmatrix} \Phi^{-1}(V - V_{d,end} \cdot e^{-\Delta t_{end}/\tau}) \\ R_{end} \\ V_{d,end} \cdot e^{-\Delta t_{end}/\tau} \\ 0 \end{pmatrix}$$

where $\Phi^{-1}(\ )$ is an inverse of a monotonic relationship between the open circuit voltage and the State of Charge of the rechargeable cell, V is a measured voltage, $\Delta t_{end}$ is an elapse of time since the last error-free use of the extended Kalman filter, $R_{end}$ is the last recorded internal resistance, $V_{d,end}$ is the last recorded distortion voltage component and $\tau$ is a cell relaxation time constant based upon battery temperature.

9. The cell monitoring apparatus as claimed in claim 1, and further comprising:
    a cell data selection unit arranged to receive open circuit voltage data in respect of a plurality of rechargeable cells of a battery, the cell data selection unit being arranged to select the rechargeable cell from amongst the plurality of rechargeable cells, the rechargeable cell having the lowest open circuit voltage of the plurality of rechargeable cells.

10. The apparatus as claimed in claim 9, wherein the cell data selection unit is arranged to select another rechargeable cell from amongst the plurality of rechargeable cells, the another rechargeable cell having the highest open circuit voltage of the plurality of rechargeable cells.

11. The apparatus as claimed in claim 9, wherein the estimator unit is arranged to evaluate the criterion in respect of the cell having the lowest open circuit voltage and in respect of the cell having the highest open circuit voltage.

12. The apparatus as claimed in claim 11, wherein the estimator unit is arranged to calculate an arithmetic mean in respect of the cell having the lowest open circuit voltage and in respect of the cell having the highest open circuit voltage in order to evaluate the criterion.

13. The apparatus as claimed in claim 11, wherein the criterion is the State of Charge of the battery.

14. The apparatus as claimed in claim 1, wherein the apparatus is comprised by a powertrain for a vehicle.

15. The apparatus as claimed in claim 14, wherein the powertrain of a vehicle further comprising a cell measurement unit capable of providing a cell voltage measurement, the estimator unit being arranged to use the cell voltage measurement.

16. The apparatus as claimed in claim 15, wherein the cell measurement unit is arranged to measure cell temperature.

17. A method of monitoring a rechargeable cell, the method comprising:
storing input state data representing initial parameters for estimating parameters of the rechargeable cell;
retrieving the input state data;
modelling the rechargeable cell as a linear time-invariant state transition model and a non-linear observation model using a non-linear open circuit voltage, an internal resistance, a time-invariant distortion voltage across a reactive component block, and a distortion current constituting an error in respect of measuring current flowing through the reactive component block, wherein the non-linear observation model is represented by the equation:

$V_t = OCV(\sigma) - RI - RI_d - V_d$ where $V_t$ is a measured voltage, $OCV(\sigma)$ is an open circuit voltage in respect of a State of Charge of the rechargeable cell, R is an internal resistance of the rechargeable cell, I is a measured current, $I_d$ is a distortion current component, and $V_d$ is a distortion voltage component;
executing code representing the linear time-invariant state model and the non-linear observation model;
filtering the state transition model and the observation model with an extended Kalman filter using the input state data in order to generate output state data; and
evaluating a criterion associated with at least part of the output state data and generating a control signal in response to evaluation of the criterion, the control signal for control of the rechargeable cell.

18. The method as claimed in claim 17, wherein an initial value of a state estimation, $\bar{x}_0$ constituting the input state data is determined by performing an operation that can be described by the equation:

$$\bar{x}_0 = \begin{pmatrix} \Phi^{-1}(OCV) \\ R_0 \\ 0 \\ 0 \end{pmatrix}$$

where $\Phi^{-1}()$ is an inverse of a monotonic relationship between the open circuit voltage and the state of charge of the rechargeable cell, and $R_0$ is an initial internal resistance.

19. The method as claimed in claim 17, wherein an initial value of a state estimation, $\bar{x}_0$, constituting the input state data is determined by performing an operation that can be described by the equation:

$$\bar{x}_0 = \begin{pmatrix} \Phi^{-1}(V - V_{d,end} \cdot e^{-\Delta t_{end}/\tau}) \\ R_{end} \\ V_{d,end} \cdot e^{-\Delta t_{end}/\tau} \\ 0 \end{pmatrix}$$

where $\Phi^{-1}()$ is an inverse of a monotonic relationship between the open circuit voltage and the State of Charge of the rechargeable cell, V is a measured voltage, $\Delta t_{end}$ is an elapse of time since the last error-free use of the extended Kalman filter, $R_{end}$ is the last recorded internal resistance, $V_{d,end}$ is the last recorded distortion voltage component and $\tau$ is a cell relaxation time constant based upon battery temperature.

* * * * *